(12) United States Patent
Jung

(10) Patent No.: US 10,354,703 B2
(45) Date of Patent: Jul. 16, 2019

(54) SEMICONDUCTOR DEVICE AND SYSTEM PERFORMING CALIBRATION OPERATION

(71) Applicant: SK hynix Inc., Icheon-si, Gyeonggi-do (KR)

(72) Inventor: Hae Kang Jung, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/201,639

(22) Filed: Nov. 27, 2018

(65) Prior Publication Data

US 2019/0139586 A1 May 9, 2019

Related U.S. Application Data

(62) Division of application No. 15/417,518, filed on Jan. 27, 2017, now abandoned.

(30) Foreign Application Priority Data

Sep. 12, 2016 (KR) .................. 10-2016-0117096

(51) Int. Cl.
| | | |
|---|---|---|
| G11C 7/12 | (2006.01) | |
| G11C 29/50 | (2006.01) | |
| G11C 29/02 | (2006.01) | |
| G11C 7/10 | (2006.01) | |
| G11C 5/06 | (2006.01) | |
| G11C 7/22 | (2006.01) | |

(52) U.S. Cl.
CPC ................ *G11C 7/12* (2013.01); *G11C 5/063* (2013.01); *G11C 7/1051* (2013.01); *G11C 7/1057* (2013.01); *G11C 7/1084* (2013.01); *G11C 7/22* (2013.01); *G11C 29/022* (2013.01); *G11C 29/028* (2013.01); *G11C 29/50008* (2013.01)

(58) Field of Classification Search
CPC ............ G11C 7/12; G11C 7/1051; G11C 7/22
USPC ........ 365/189.11, 46, 51, 52, 55, 54, 59, 63, 365/129, 148, 189.18, 192, 197, 1, 98, 365/244
See application file for complete search history.

(56) References Cited

U.S. PATENT DOCUMENTS

| | | | |
|---|---|---|---|
| 2011/0242916 A1* | 10/2011 | Seol ........................ | G11C 5/063 365/198 |
| 2012/0081146 A1* | 4/2012 | Oh ........................ | G11C 7/1048 326/30 |
| 2012/0099383 A1* | 4/2012 | Kim ...................... | G11C 7/1057 365/189.02 |
| 2014/0340976 A1* | 11/2014 | Fujisawa .......... | G11C 11/40615 365/222 |
| 2016/0012879 A1* | 1/2016 | Eom .................... | G11C 11/4096 365/51 |
| 2018/0026634 A1 | 1/2018 | Park et al. | |

FOREIGN PATENT DOCUMENTS

KR          1020120040775 A          4/2012

\* cited by examiner

*Primary Examiner* — Fernando Hidalgo
(74) *Attorney, Agent, or Firm* — William Park & Associates Ltd.

(57) ABSTRACT

A semiconductor device may include a calibration circuit and an output circuit. The calibration circuit may perform a calibration operation for setting a resistance value of the output circuit. The calibrations circuit may perform the calibration operation by being coupled, through a signal transmission line, to a reference resistor provided in another semiconductor device.

10 Claims, 8 Drawing Sheets

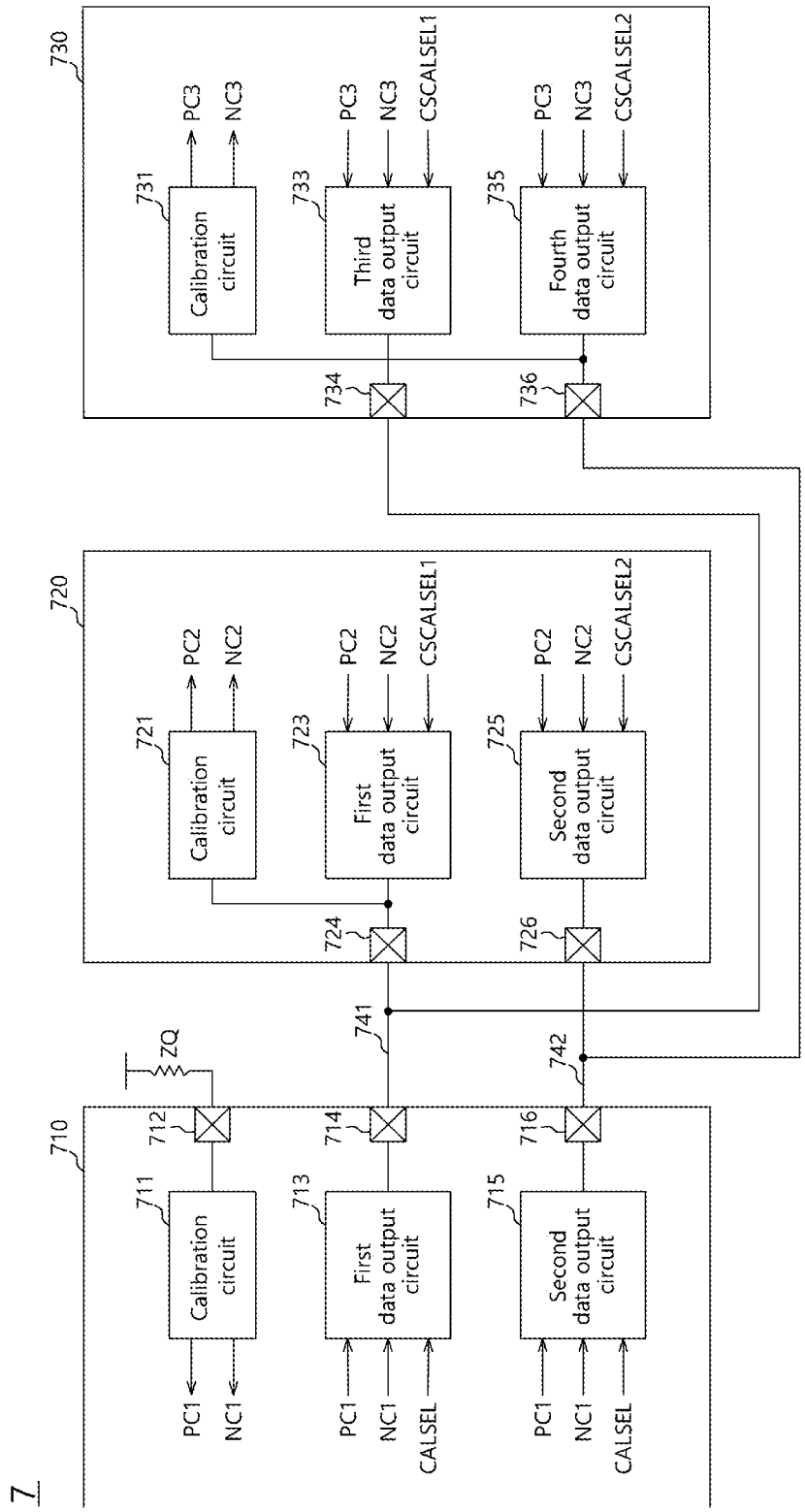

SEMICONDUCTOR DEVICE AND SYSTEM PERFORMING CALIBRATION OPERATION

CROSS-REFERENCES TO RELATED APPLICATION

The present application is a divisional application of U.S. patent application 15/417,518 and claims priority under 35 U.S.C. § 119(a) to Korean application number 10-2016-0117096, filed on Sep. 12, 2016, in the Korean Intellectual Property Office, which is incorporated herein by reference in its entirety.

BACKGROUND

1. Technical Field

Various embodiments generally relate to a semiconductor technology, and, more particularly, to a semiconductor device and system performing a calibration operation.

2. Related Art

An electronic apparatus may include a large number of electronic components. For instance, a computer system may include many semiconductor devices, which are semiconductor based electronic components. These semiconductor devices may transmit data in synchronization with a clock, and may perform serial communication. As semiconductor devices operate with low signal voltages and high operating frequencies, electronic signals are subject to the influence of noise, and impedance mismatching between semiconductor devices communicating with each other may lead to signal distortion.

In order to avoid such signal distortion, a semiconductor device may include an on-die termination circuit performing impedance matching for signal integrity purposes. Moreover, the semiconductor device may perform an impedance calibration with respect to termination resistance according to PVT variations for the purpose of precise impedance matching. In general, a memory device may be coupled to an external reference resistor, and calibrates the impedance value of a termination resistor by performing a calibration operation by using the external reference resistor. This is generally referred to as a ZQ calibration operation.

SUMMARY

In an embodiment, a semiconductor device may include a calibration circuit and an output circuit. The calibration circuit may perform a calibration operation by being coupled, through a signal transmission line, to a reference resistor provided in a controller. The output circuit may be coupled to the signal transmission line. Here, a resistance value of the output circuit may be set based on a result of the calibration operation.

In an embodiment, a semiconductor system may include a first semiconductor device and a second semiconductor device. The first semiconductor device may include an output circuit coupled to a signal transmission line. The second semiconductor device may include an output circuit coupled to the signal transmission line and a calibration circuit configured to perform a calibration operation by being coupled, through the signal transmission line, to a reference resistor provided in the first semiconductor device. Here, a resistance value of the output circuit of the second semiconductor device may be set based on a result of the calibration operation.

In an embodiment, a semiconductor system may include a first semiconductor device and a second semiconductor device. The first semiconductor device may be coupled to a signal transmission line, and may include an output circuit including a plurality of pull-up resistor legs and a plurality of pull-down resistor legs. The second semiconductor device may include an output circuit and a calibration circuit. The output circuit may be coupled to the signal transmission line, and may include a plurality of pull-up resistor legs and a plurality of pull-down resistor legs. The calibration circuit may be coupled to the signal transmission line, and may perform a calibration operation to set resistance values of the plurality of pull-up resistor legs and the plurality of pull-down resistor legs of the output circuit of the second semiconductor device.

In an embodiment, a method of operating a semiconductor system including a controller and a memory device coupled to each other through a signal transmission line may include performing a calibration operation of the controller by being coupled with an external reference resistor, and setting a resistance value of a controller output circuit which is coupled to the signal transmission line, based on a result of the calibration operation of the controller. The method may include performing a calibration operation of the memory device by being coupled to the controller output circuit through the signal transmission line and by being coupled to a reference resistor provided from the controller output circuit, and setting a resistance value of a memory output circuit coupled to the signal transmission line, based on a result of the calibration operation of the memory device.

In an embodiment, a semiconductor system may include a controller, a first memory device, and a second memory device. The controller may be coupled to first and second signal transmission lines. The first memory device may be coupled to the first and second signal transmission lines, and may include a first memory calibration circuit. The second memory device may be coupled to the first and second signal transmission lines, and may include a second memory calibration circuit. Here, the first memory calibration circuit may perform a calibration operation by being coupled to the first signal transmission line based on a first chip calibration select signal, and the second memory calibration circuit may perform a calibration operation by being coupled to the second signal transmission line based on a second chip calibration select signal.

In an embodiment, a semiconductor system may include a controller and a memory device. The controller may include a controller calibration circuit performing a calibration operation by being coupled to an external reference resistor. The memory device may include a memory calibration circuit performing a calibration operation by being coupled to the external reference resistor.

BRIEF DESCRIPTION OF THE DRAWINGS

FIG. 7 is a diagram illustrating an example configuration of a semiconductor system in accordance with an embodiment.

DETAILED DESCRIPTION

Hereinafter, a semiconductor device and system performing a calibration operation will be described below with reference to the accompanying drawings through various examples of embodiments.

Figure 1:
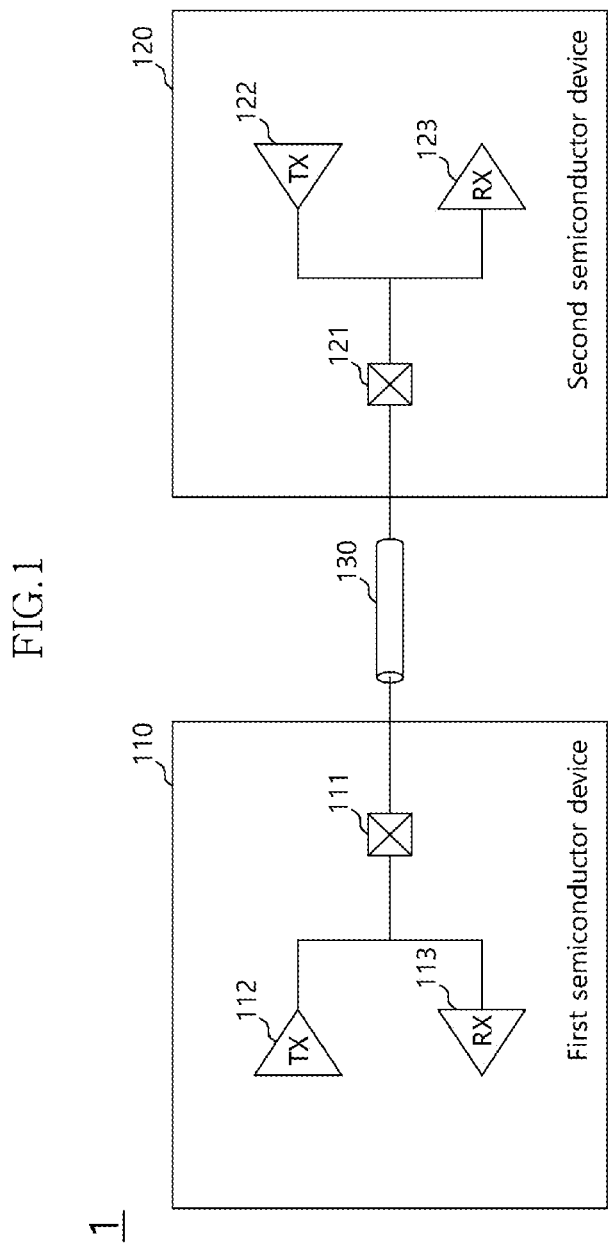
FIG. 1 is a diagram schematically illustrating an example configuration of a semiconductor system in accordance with an embodiment.

FIG. 1 is a diagram illustrating an example configuration of a semiconductor system 1 in accordance with an embodiment. In FIG. 1, the semiconductor system 1 in accordance with an embodiment may include a first semiconductor device 110 and a second semiconductor device 120. The first semiconductor device 110 and the second semiconductor device 120 may be electronic components that communicate with each other. In an embodiment, the first semiconductor device 110 may be a master device, and the second semiconductor device 120 may be a slave device that is controlled by the first semiconductor device 110. For example, the first semiconductor device 110 may be a host device such as a processor or a controller, and may include one or more of a central processing unit (CPU), a graphic processing unit (GPU), a multimedia processor (MMP), a digital signal processor (DSP), and a memory controller. Furthermore, the first semiconductor device 110 may be realized in the form of a system-on-chip by integrating various electronic components including processor chips having various functions, such as application processors (AP), into a single chip. Also, the first semiconductor device 110 may be an interface chip for communicating with the second semiconductor device 120. The second semiconductor device 120 may be a memory device that includes one or more of a volatile memory and a nonvolatile memory. Examples of the volatile memory may include a static RAM (SRAM), a dynamic RAM (DRAM), and a synchronous DRAM (SDRAM), and examples of the nonvolatile memory may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), and a ferroelectric RAM (FRAM). Also, the second semiconductor device 120 may be an interface chip for communicating with the first semiconductor device 110.

The first and second semiconductor devices 110 and 120 may be coupled to each other through a signal transmission line 130. The first semiconductor device 110 may include a pad 111, and the pad 111 may be coupled to the signal transmission line 130. The second semiconductor device 120 may include a pad 121, and the pad 121 may be coupled to the signal transmission line 130. The signal transmission line 130 may be channels, links, or buses. For example, the signal transmission line 130 may transmit any signal that may be used in a general semiconductor system, such as data, a clock, an address, or a command. The first semiconductor device 110 may include an output circuit (TX) 112 and a reception circuit (RX) 113. The output circuit 112 may generate an output signal according to an internal signal of the first semiconductor device 110, and may transmit the output signal to the second semiconductor device 120 through the signal transmission line 130. The reception circuit 113 may receive a signal transmitted from the second semiconductor device 120 through the signal transmission line 130, and may generate an internal signal. Similarly, the second semiconductor device 120 may include an output circuit (TX) 122 and a reception circuit (RX) 123. The output circuit 122 may generate an output signal according to an internal signal of the second semiconductor device 120, and may transmit the output signal to the first semiconductor device 110 through the signal transmission line 130. The reception circuit 123 may receive a signal transmitted from the first semiconductor device 110 through the signal transmission line 130, and may generate an internal signal.

The output circuits 112 and 122 of the first and second semiconductor devices 110 and 120 may set their resistance values through impedance calibration operations (e.g., ZQ calibration). Each of the first and second semiconductor devices 110 and 120 may further include calibration circuits (not illustrated), which performs impedance calibration operations to set the resistance values of the output circuits 112 and 122. In an embodiment, the calibration circuit of the first semiconductor device 110 may perform the calibration operation by being coupled to an external reference resistor. In an embodiment, the calibration circuit of the second semiconductor device 120 may perform the calibration operation without being coupled to an external reference resistor. Instead, the calibration circuit of the second semiconductor device 120 may perform the calibration operation by being coupled to the first semiconductor device 110 through the signal transmission line 130. The output circuit 112 of the first semiconductor device 110 may provide a reference resistance through the signal transmission line 130. For example, in performing the impedance calibration operation, the calibration circuit of the second semiconductor device 120 may use a resistance element of the output circuit 112 of the first semiconductor device 110, which is coupled to the second semiconductor device 120 through the signal transmission line 130, as a reference resistance element.

Figure 2:
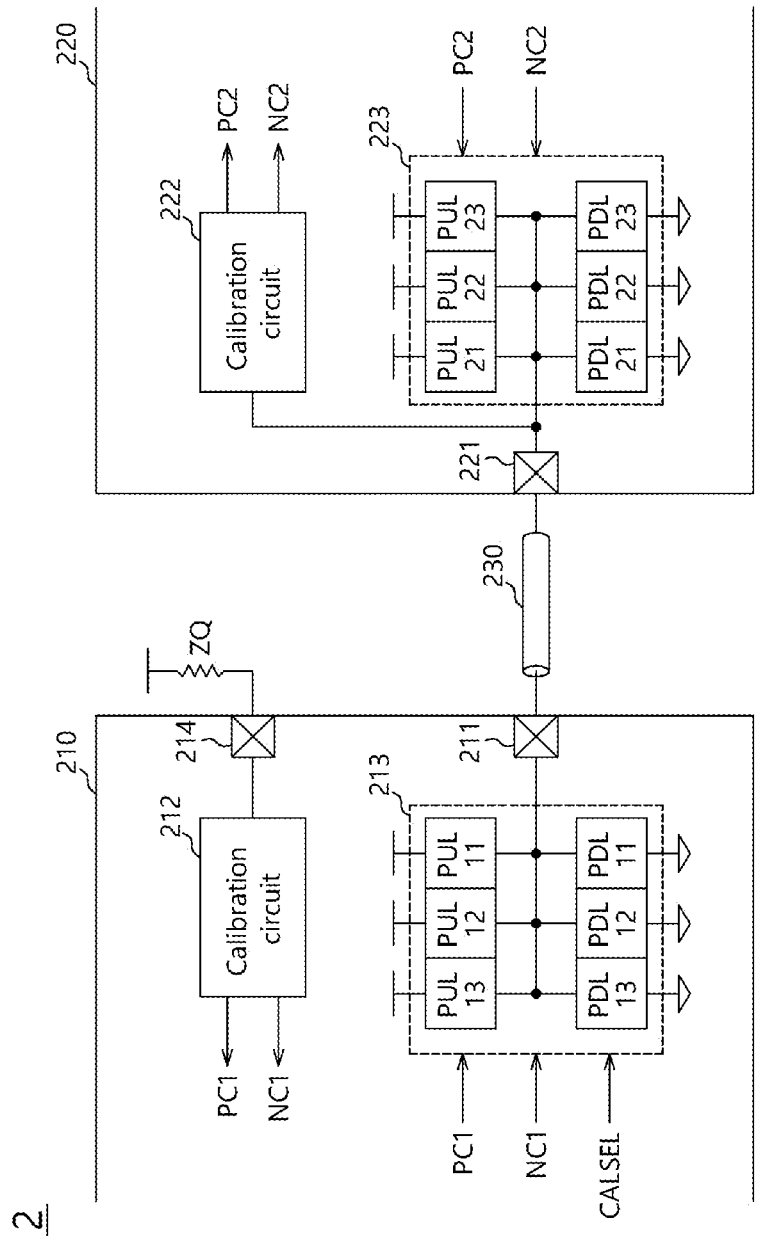
FIG. 2 is a diagram illustrating an example configuration of a semiconductor system in accordance with an embodiment.

FIG. 2 is a diagram illustrating an example configuration of a semiconductor system 2 in accordance with an embodiment. The semiconductor system 2 may include a first semiconductor device and a second semiconductor device. In FIG. 2, the semiconductor system 2 may include a controller 210 and a memory device 220. Here, the controller 210 may be an example of the first semiconductor device, and the memory device 220 may be an example of the second semiconductor device. The controller 210 and the memory device 220 may communicate with each other through a signal transmission line. The signal transmission line may be, for example, a data transmission line 230. The controller 210 and the memory device 220 may perform data communication through the data transmission line 230. The controller 210 controls the memory device 220 such that the memory device 220 may perform various operations. The controller 210 may include a pad, and the pad may be a data pad 211. The controller 210 may be coupled to the data transmission line 230 through the data pad 211. The controller 210 may include a controller calibration circuit 212 and a controller output circuit, and the controller output circuit may be, for example, a controller data output circuit 213. The controller calibration circuit 212 may be coupled to an external reference resistor ZQ through a resistor pad 214. One end of the external reference resistor ZQ may be coupled to the controller calibration circuit 212 through the resistor pad 214, and the other end of the external reference resistor ZQ may be coupled to a high voltage such as a power supply voltage or a low voltage such as a ground voltage. The controller calibration circuit 212 may perform a calibration operation (e.g., impedance calibration operation) by using the external reference resistor ZQ. The controller calibration circuit 212 may set the resistance value of the controller data output circuit 213 based on the result of the calibration operation. The controller calibration circuit 212 may generate a first pull-up code PC1 and a first pull-down code NC1 by performing the calibration operation.

The controller data output circuit 213 may generate output data to be transmitted through the data transmission line 230, from the internal data of the controller 210. The resistance value of the controller data output circuit 213 may be set based on the result of the calibration operation of the controller calibration circuit 212. The controller data output circuit 213 may include a plurality of pull-up resistor legs PUL11, PUL12, and PUL13 and a plurality of pull-down resistor legs PDL11, PDL12, and PDL13. Each of the plurality of pull-up resistor legs PUL11, PUL12, and PUL13 may be coupled to the power supply voltage at one end thereof, and, at the other end thereof, may be coupled to the data transmission line 230 through the data pad 211. Each of the plurality of pull-down resistor legs PDL11, PDL12 and PDL13 may be coupled to the ground voltage at one end thereof, and, at the other end thereof, may be coupled to the data transmission line 230 through the data pad 211. Each of the plurality of pull-up resistor legs PUL11, PUL12, and PUL13 and the plurality of pull-down resistor legs PDL11, PDL12, and PDL13 may function as a termination resistor of the controller data output circuit 213. The resistance values of the plurality of pull-up resistor legs PUL11, PUL12, and PUL13 and the plurality of pull-down resistor legs PDL11, PDL12, and PDL13 may be set, respectively, based on the calibration operation of the controller calibration circuit 212. The controller data output circuit 213 may receive the first pull-up code PC1 and the first pull-down code NC1. The resistance values of the plurality of pull-up resistor legs PUL11, PUL12, and PUL13 may be set based on the first pull-up code PC1, and the resistance values of the plurality of pull-down resistor legs PDL11, PDL12, and PDL13 may be set based on the first pull-down code NC1. For example, each of the pull-up resistor legs PUL11, PUL12, and PUL13 and the pull-down resistor legs PDL11, PDL12, and PDL13 may be set to the resistance value of 60 ohms, 120 ohms or 240 ohms.

The controller 210 may provide a reference resistance for the calibration operation of the memory device 220, through the data transmission line 230. For example, the controller data output circuit 213 may provide a reference resistance to the memory device 220 through the data transmission line 230. In performing the impedance calibration operation, the memory device 220 may use a resistance element of the controller data output circuit 213, which is coupled to the memory device 220 through the data transmission line 230, as a reference resistance element. The controller 210 may couple at least one of the plurality of pull-up resistor legs PUL11, PUL12, and PUL13 and the plurality of pull-down resistor legs PDL11, PDL12, and PDL13 to the data transmission line 230, based on a calibration select signal CALSEL. The calibration select signal CALSEL may be generated based on a calibration signal, which may be transmitted from the controller 210 to the memory device 220 for the calibration operation of the memory device 220. For example, at least one of the plurality of pull-up resistor legs PUL11, PUL12, and PUL13 and the plurality of pull-down resistor legs PDL11, PDL12, and PDL13 may be turned on based on the calibration select signal CALSEL, and the turned-on resistor leg may be coupled to the data transmission line 230. The turned-on resistor leg may be provided as a reference resistor for the calibration operation of the memory device 220.

The memory device 220 may include a pad, and the pad may be a data pad 221. The memory device 220 may be coupled to the data transmission line 230 through the data pad 221. The memory device 220 may include a memory calibration circuit 222 and a memory output circuit. Here, the memory output circuit may be, for example, a memory data output circuit 223. The memory calibration circuit 222 may perform the calibration operation based on the reference resistance provided from the controller 210 through the data transmission line 230. Instead of having a resistor pad such as the resistor pad 214, the memory device 220 may use the reference resistance of the controller 210. The memory calibration circuit 222 may perform the calibration operation by using the reference resistance provided from the controller 210 through the data transmission line 230, instead of being coupled to an external reference resistor through a resistor pad. The memory calibration circuit 222 may set the resistance value of the memory data output circuit 223 based on the result of the calibration operation. The memory calibration circuit 222 may generate a second pull-up code PC2 and a second pull-down code NC2 by performing the calibration operation.

The memory data output circuit 223 may generate output data to be transmitted to the controller 210 through the data transmission line 230, from the internal data of the memory device 220. The resistance value of the memory data output circuit 223 may be set based on the result of the calibration operation of the memory calibration circuit 222. The memory data output circuit 223 may include a plurality of pull-up resistor legs PUL21, PUL22, and PUL23 and a plurality of pull-down resistor legs PDL21, PDL22, and PDL23. Each of the plurality of pull-up resistor legs PUL21, PUL22, and PUL23 may be coupled to a terminal of the power supply voltage at one end thereof, and, at the other end thereof, may be coupled to the data transmission line 230 through the data pad 221. Each of the plurality of pull-down resistor legs PDL21, PDL22 and PDL23 may be coupled to a terminal of the ground voltage, and, at the other end thereof, may be coupled to the data transmission line 230 through the data pad 221. Each of the plurality of pull-up resistor legs PUL21, PUL22, and PUL23 and the plurality of pull-down resistor legs PDL21, PDL22, and PDL23 may function as the termination resistor of the memory data output circuit 223. The resistance values of the plurality of pull-up resistor legs PUL21, PUL22, and PUL23 and the plurality of pull-down resistor legs PDL21, PDL22, and PDL23 may be set, respectively, based on the result of the calibration operation. The memory data output circuit 223 may receive the second pull-up code PC2 and the second pull-down code NC2. The resistance values of the plurality of pull-up resistor legs PUL21, PUL22, and PUL23 may be set based on the second pull-up code PC2. The resistance values of the plurality of pull-down resistor legs PDL21, PDL22, and PDL23 may be set based on the second pull-down code NC2. For example, each of the plurality of pull-up resistor legs PUL21, PUL22, and PUL23 and the plurality of pull-down resistor legs PDL21, PDL22, and PDL23 may be set to the resistance value of 60 ohms, 120 ohms or 240 ohms.

The memory device 220 may perform the calibration operation by using the reference resistance provided from the controller 210 through the data transmission line 230, instead of using an external reference resistor. Since the memory device 220 does not need to include a resistor pad, therefore, the manufacturing cost may be reduced. Moreover, by using a resistor pad as a power pad, operation performance may be improved.

Figure 3:
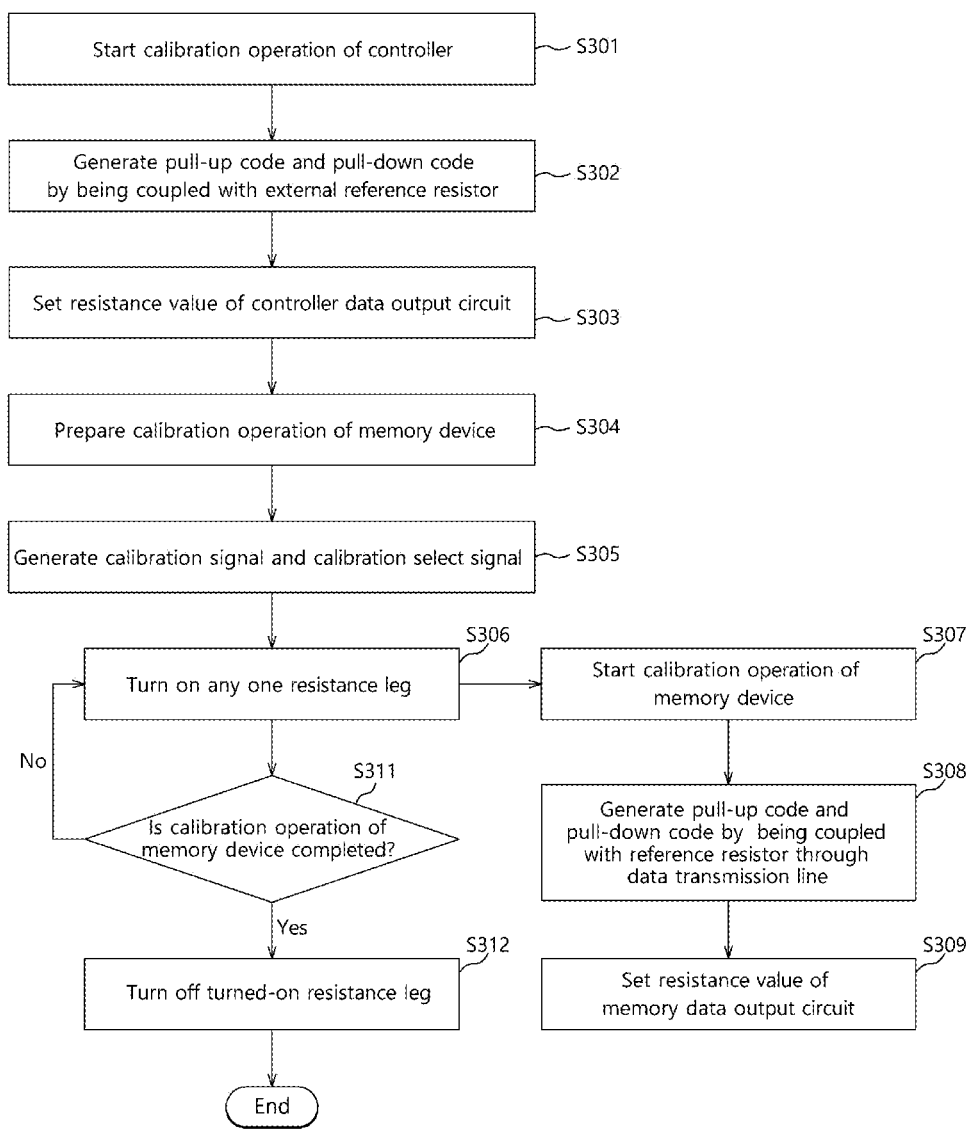
FIG. 3 is an example of a flow chart showing operations of the semiconductor system in accordance with an embodiment.
Figure 4A:
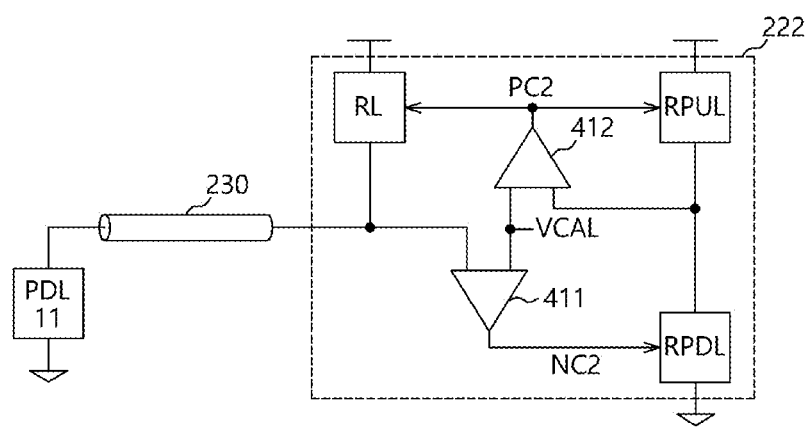
FIGS. 4A and 4B are diagrams showing operations of the semiconductor system in accordance with an embodiment.
Figure 4B:
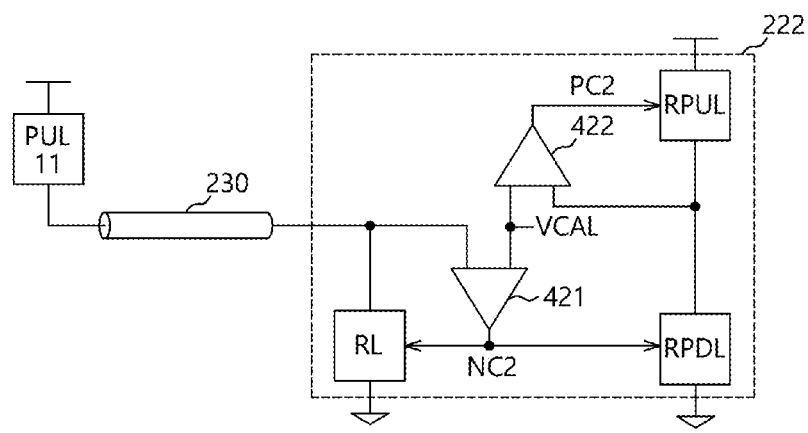

FIG. 3 is an example of a flow chart showing operations of the semiconductor system 2 in accordance with an embodiment, and FIGS. 4a and 4b are diagrams showing operation methods of the semiconductor system 2 in accordance with an embodiment. The operation method of the semiconductor system 2 in accordance with an embodiment will be described below with reference to FIGS. 2 to 4b. First, the controller 210 may perform a calibration operation (S301). The controller calibration circuit 212 may generate the first pull-up code PC1 and the first pull-down code NC1 by using a resistance value of the external reference resistor ZQ (S302). The pull-up resistor legs PUL11, PUL12, and PUL13 of the controller data output circuit 213 may be set to predetermined resistance values based on the first pull-up code PC1, and the pull-down resistor legs PDL11, PDL12, and PDL13 of the controller data output circuit 213 may be set to predetermined resistance values based on the first pull-down code NC1 (S303). If the resistance value setting (e.g., calibration) of the controller data output circuit 213 is completed, the controller 210 may prepare the calibration operation of the memory device 220 (S304). Thereafter, the controller 210 may generate a calibration signal, and the memory device 220 may perform the calibration operation based on the calibration signal. Also, the calibration select signal CALSEL may be generated based on the calibration signal (S305).

In FIG. 4A, the controller 210 may turn on one of the pull-down resistor legs PDL11, PDL12, and PDL13 of the controller data output circuit 213, based on the calibration select signal CALSEL. For example, the controller 210 may turn on the first pull-down resistor leg PDL11, and then the first pull-down resistor leg PDL11 may be coupled to the data transmission line 230 (S306).

The memory device 220 may perform the calibration operation based on the calibration signal (S307). The memory calibration circuit 222 may use, as a reference resistor, the pull-down resistor leg PDL11 coupled through the data transmission line 230. In FIG. 4A, the memory calibration circuit 222 may include a reference resistor leg RL, a replica pull-up resistor leg RPUL, a replica pull-down resistor leg RPDL, a first comparator 411, and a second comparator 412. The reference resistor leg RL may be, for example, a pull-up resistor leg. The reference resistor leg RL may be coupled to the pull-down resistor leg PDL11 through the data transmission line 230. The first comparator 411 may generate the second pull-down code NC2 by comparing the voltage level of the data transmission line 230, which is determined based on the resistance ratio of the pull-down resistor leg PDL11 and the reference resistor leg RL, with the level of a calibration reference voltage VCAL. The calibration reference voltage VCAL may be a voltage that has a predetermined level for the calibration operation. The second comparator 412 may generate the second pull-up code PC2 by comparing the level of the calibration reference voltage VCAL with a voltage level determined based on the resistance ratio of the replica pull-up resistor leg RPUL and the replica pull-down resistor leg RPDL. The memory calibration circuit 222 may set first the second pull-up code PC2, and may then set the second pull-down code NC2 based on the set second pull-up code PC2 (S308). If the second pull-up code PC2 and the second pull-down code NC2 are generated, the pull-up resistor legs PUL21, PUL22, and PUL23 of the memory data output circuit 223 may set their resistance values based on the second pull-up code PC2, and the pull-down resistor legs PDL21, PDL22 and PDL23 of the memory data output circuit 223 may set their resistance values based on the second pull-down code NC2 (S309).

In FIG. 4B, the controller 210 may turn on one of the pull-up resistor legs PUL11, PUL12, and PUL13 of the controller data output circuit 213, based on the calibration select signal CALSEL. For example, the controller 210 may turn on the first pull-up resistor leg PUL11, and then the first pull-up resistor leg PUL11 may be coupled to the data transmission line 230. The memory calibration circuit 222 may use, as a reference resistor, the pull-up resistor leg PUL11 coupled through the data transmission line 230. In FIG. 4B, the memory calibration circuit 222 may include a reference resistor leg RL, a replica pull-up resistor leg RPUL, a replica pull-down resistor leg RPDL, a first comparator 421, and a second comparator 422. The reference resistor leg RL may be coupled to the pull-up resistor leg PUL11 through the data transmission line 230. The reference resistor leg RL may be a pull-down resistor leg. The first comparator 421 may generate the second pull-down code NC2 by comparing the voltage level of the data transmission line 230, which is determined based on the resistance ratio of the pull-up resistor leg PUL11 and the reference resistor leg RL, with the level of a calibration reference voltage VCAL. If the setting of the second pull-down code NC2 is completed, the resistance value of the replica pull-down resistor leg RPDL may be set. The second comparator 422 may generate the second pull-up code PC2 by comparing the level of the calibration reference voltage VCAL with a voltage level determined based on the resistance ratio of the replica pull-up resistor leg RPUL and the replica pull-down resistor leg RPDL. The memory calibration circuit 222 may set first the second pull-down code NC2, and may then set the second pull-up code PC2 based on the set second pull-down code NC2 (S308). The pull-up resistor legs PUL21, PUL22, and PUL23 of the memory data output circuit 223 may set their resistance values based on the second pull-up code PC2, and the pull-down resistor legs PDL21, PDL22, and PDL23 of the memory data output circuit 223 may set their resistance values based on the second pull-down code NC2 (S309). Under the control of the controller 210, the resistor leg turned on based on the calibration select signal CALSEL may remain turned on until the calibration operation of the memory device 220 is completed (S311). If the resistance value setting (e.g., calibration) of the memory data output circuit 223 is completed, the controller 210 turns off the turned-on resistor leg (S312), and the calibration operation of the semiconductor system 2 may end.

Figure 5:
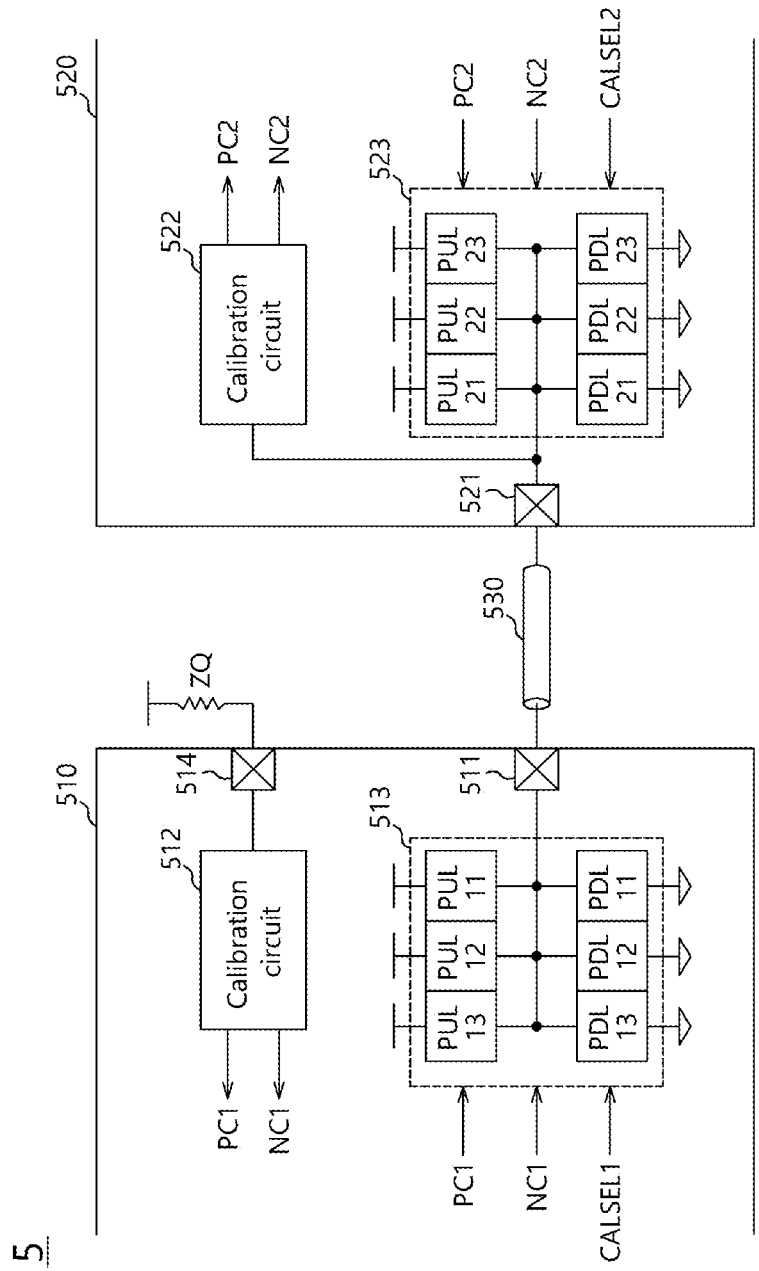
FIG. 5 is a diagram illustrating an example configuration of a semiconductor system in accordance with an embodiment.

FIG. 5 is a diagram illustrating an example configuration of a semiconductor system 5 in accordance with an embodiment. In FIG. 5, the semiconductor system 5 may include a controller 510 and a memory device 520. The controller 510 may include a controller calibration circuit 512 and a controller data output circuit 513. The controller calibration circuit 512 may be coupled to an external reference resistor ZQ through a resistor pad 514, and may perform a calibration operation by using the external reference resistor ZQ. The controller calibration circuit 512 may generate a first pull-up code PC1 and a first pull-down code NC1 through the calibration operation. The controller data output circuit 513 may be coupled to a data transmission line 530 through a data pad 511. The controller data output circuit 513 may include a plurality of pull-up resistor legs PUL11, PUL12, and PUL13 and a plurality of pull-down resistor legs PDL11, PDL12, and PDL13. The resistance values of the plurality of pull-up resistor legs PUL11, PUL12, and PUL13 may be set based on the first pull-up code PC1, and the resistance values of the plurality of pull-down resistor legs PDL11, PDL12, and PDL13 may be set based on the first pull-down code NC1. The controller 510 may turn on at least one of the plurality of pull-up resistor legs PUL11, PUL12, and PUL13 and the plurality of pull-down resistor legs PDL11, PDL12, and PDL13, based on a first calibration select signal CALSEL1. The turned-on resistor leg may be coupled to the data transmission line 230. The turned-on resistor leg may be provided as a reference resistor for the calibration operation of the memory device 520.

The memory device 520 may include a memory calibration circuit 522 and a memory data output circuit 523. The memory calibration circuit 522 may perform the calibration operation by using the reference resistance provided from the controller 510 through the data transmission line 530. The memory calibration circuit 522 may generate a second pull-up code PC2 and a second pull-down code NC2 through the calibration operation. The memory data output circuit 523 may include a plurality of pull-up resistor legs PUL21, PUL22, and PUL23 and a plurality of pull-down resistor legs PDL21, PDL22, and PDL23. The resistance values of the plurality of pull-up resistor legs PUL21, PUL22, and PUL23 may be set based on the second pull-up code PC2, and the resistance values of the plurality of pull-down resistor legs PDL21, PDL22, and PDL23 may be set based on the second pull-down code NC2. The memory device 520 may turn on at least one of the plurality of pull-up resistor legs PUL21, PUL22, and PUL23 and the plurality of pull-down resistor legs PDL21, PDL22, and PDL23, based on a second calibration select signal CALSEL2. The turned-on resistor leg may be coupled to the data transmission line 230. The memory calibration circuit 522 may perform the calibration operation by using the turned-on resistor leg of the controller data output circuit 513 and the turned-on resistor leg of the memory data output circuit 523, which are coupled through the data transmission line 530. The first and second calibration select signals CALSEL1 and CALSEL2 may be generated from a calibration signal generated in the controller 210, for the calibration operation of the memory device 520.

Figure 6A:
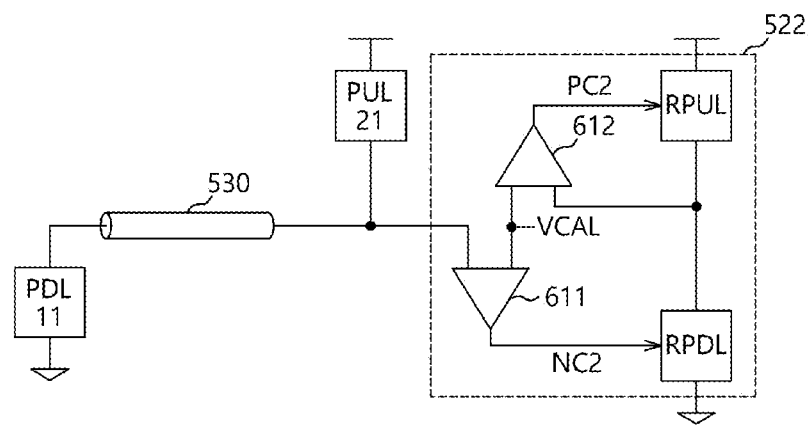
FIGS. 6A and 6B are diagrams showing operations of the semiconductor system in accordance with an embodiment.
Figure 6B:
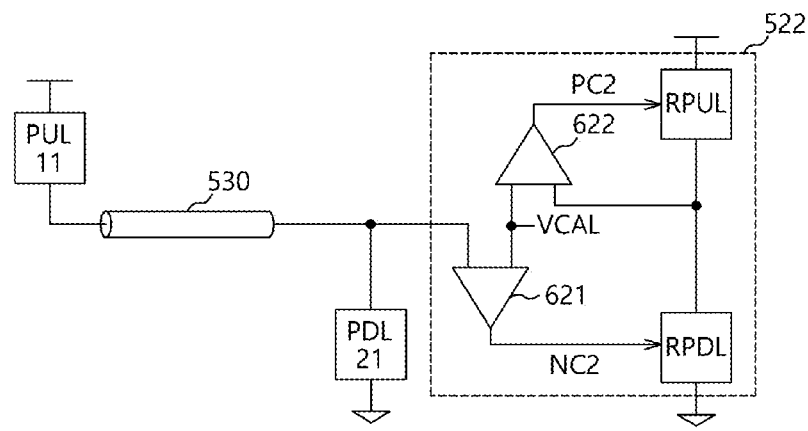

FIGS. 6a and 6b are diagrams showing the operation method of the semiconductor system 5 in accordance with an embodiment. The operation of the semiconductor system 5 in accordance with an embodiment will be described below with reference to FIGS. 5 to 6b. First, the controller 510 may perform a calibration operation. The controller calibration circuit 512 may generate the first pull-up code PC1 and the first pull-down code NC1 by using a resistance value of the external reference resistor ZQ. The pull-up resistor legs PUL11, PUL12, and PUL13 of the controller data output circuit 513 may be set to predetermined resistance values based on the first pull-up code PC1, and the pull-down resistor legs PDL11, PDL12, and PDL13 of the controller data output circuit 513 may be set to predetermined resistance values based on the first pull-down code NC1. Thereafter, the controller 510 may generate a calibration signal, and the memory device 520 may perform the calibration operation based on the calibration signal. Also, based on the calibration signal, the first and second calibration select signals CALSEL1 and CALSEL2 may be generated.

In FIG. 6A, the controller 510 may turn on at least one of the pull-down resistor legs PDL11, PDL12, and PDL13 of the controller data output circuit 513, based on the first calibration select signal CALSEL1. The memory device 520 may turn on at least one of the plurality of pull-up resistor legs PUL21, PUL22, and PUL23 of the memory data output circuit 523, based on the second calibration select signal CALSEL2. For example, the first pull-down resistor leg PDL11 of the controller data output circuit 513 may be turned on based on the first calibration select signal CALSEL1, and the first pull-up resistor leg PUL21 of the memory data output circuit 523 may be turned on based on the second calibration select signal CALSEL2. The memory calibration circuit 522 may include a replica pull-up resistor leg RPUL, a replica pull-down resistor leg RPDL, a first comparator 611, and a second comparator 612. Since the memory device 520 performs the calibration operation by using the resistor leg of the memory data output circuit 523, the memory calibration circuit 522 does not need to include the reference resistor leg RL unlike the memory calibration circuit 222 illustrated in FIGS. 4a and 4b, and thus may help reducing the overall size of the memory device 520.

The first comparator 611 may be coupled to the data transmission line 530, and may generate the second pull-down code NC2 by comparing the level of a calibration reference voltage VCAL with a voltage level determined based on the resistance ratio of the pull-down resistor leg PDL11 and the pull-up resistor leg PUL21. The second comparator 612 may generate the second pull-up code PC2 by comparing the level of the calibration reference voltage VCAL with a voltage level determined based on the resistance ratio of the replica pull-up resistor leg RPUL and the replica pull-down resistor leg RPDL. The memory calibration circuit 522 may set first the second pull-up code PC2 and then set the second pull-down code NC2. The pull-up resistor legs PUL21, PUL22, and PUL23 of the memory data output circuit 523 may be set to predetermined resistance values, based on the second pull-up code PC2, and the pull-down resistor legs PDL21, PDL22, and PDL23 of the memory data output circuit 223 may be set to the predetermined resistance values, based on the second pull-down code NC2.

FIG. 6B illustrates an example where the first pull-up resistor leg PUL11 of the controller data output circuit 513 is turned on based on the first calibration select signal CALSEL1 and the first pull-down resistor leg PDL21 of the memory data output circuit 523 is turned on based on the second calibration select signal CALSEL2. In FIG. 6B, the memory calibration circuit 522 may include a replica pull-up resistor leg RPUL, a replica pull-down resistor leg RPDL, a first comparator 621, and a second comparator 622. The first comparator 621 may be coupled to the data transmission line 530, and may generate the second pull-down code NC2 by comparing the level of a calibration reference voltage VCAL with a voltage level determined based on the resistance ratio of the pull-up resistor leg PUL11 and the pull-down resistor leg PDL21. The resistance value of the replica pull-down resistor leg RPDL may be set according to the second pull-down code NC2. The second comparator 622 may generate the second pull-up code PC2 by comparing the level of the calibration reference voltage VCAL with a voltage level determined based on the resistance ratio of the replica pull-up resistor leg RPUL and the replica pull-down resistor leg RPDL. The pull-up resistor legs PUL21, PUL22, and PUL23 of the memory data output circuit 523 may be set to predetermined resistance values, based on the second pull-up code PC2, and the pull-down resistor legs PDL21, PDL22, and PDL23 of the memory data output circuit 223 may be set to the predetermined resistance values, based on the second pull-down code NC2.

FIG. 7 is a diagram illustrating an example configuration of a semiconductor system 7 in accordance with an embodiment. In FIG. 7, the semiconductor system 7 may include a controller 710, a first memory device 720, and a second memory device 730. The first and second memory devices 720 and 730 may be integrated into a single memory device or one memory module. The controller 710 may be coupled in common to the first and second memory devices 720 and 730 through data transmission lines 741 and 742. The controller 710 may be coupled to the first data transmission line 741 through a first data pad 714, and may be coupled to the second data transmission line 742 through a second data pad 716. The first memory device 720 may be coupled to the first data transmission line 741 through a first data pad 724, and may be coupled to the second data transmission line 742 through a second data pad 726. The second memory device 730 may be coupled to the first data transmission line 741 through a first data pad 734, and may be coupled to the second data transmission line 742 through a second data pad 736.

The controller 710 may include a controller calibration circuit 711, a first controller data output circuit 713, and a second controller data output circuit 715. The controller calibration circuit 711 may be coupled to an external reference resistor ZQ through a resistor pad 712. The controller calibration circuit 711 may perform a calibration operation by being coupled to the external reference resistor ZQ. The controller calibration circuit 711 may generate a first pull-up code PC1 and a first pull-down code NC1. The first controller data output circuit 713 may be coupled to the first data transmission line 741 through the first data pad 714. The first controller data output circuit 713 may include a plurality of pull-up resistor legs and a plurality of pull-down resistor legs. The resistance values of the plurality of pull-up resistor legs may be set based on the first pull-up code PC1, and the resistance values of the plurality of pull-down resistor legs may be set based on the first pull-down code NC1. The second controller data output circuit 715 may be coupled to the second data transmission line 742 through the second data pad 716. The second controller data output circuit 715 may include a plurality of pull-up resistor legs and a plurality of pull-down resistor legs. The resistance values of the plurality of pull-up resistor legs may be set based on the first pull-up code PC1, and the resistance values of the plurality of pull-down resistor legs may be set based on the first pull-down code NC1.

The controller 710 may turn on at least one of the plurality of pull-up resistor legs and the plurality of pull-down resistor legs of the first controller data output circuit 713, based on a calibration select signal CALSEL. The controller 710 may turn on at least one of the plurality of pull-up resistor legs and the plurality of pull-down resistor legs of the second controller data output circuit 715, based on the calibration select signal CALSEL. The turned-on resistor leg of the first controller data output circuit 713 may be coupled to the first data transmission line 741, and may be provided as a reference resistor for the calibration operation of the first and second memory devices 720 and 730. The turned-on resistor leg of the second controller data output circuit 715 may be coupled to the second data transmission line 742, and may be provided as a reference resistor for the calibration operation of the first and second memory devices 720 and 730.

The first memory device 720 may include a first memory calibration circuit 721, a first memory data output circuit 723, and a second memory data output circuit 725. The first memory calibration circuit 721 may perform the calibration operation of the first memory device 720. The first memory calibration circuit 721 may generate a second pull-up code PC2 and a second pull-down code NC2 through the calibration operation. The first memory data output circuit 723 may be coupled to the first data transmission line 741 through the first data pad 724. The first memory data output circuit 723 may include a plurality of pull-up resistor legs and a plurality of pull-down resistor legs. The resistance values of the plurality of pull-up resistor legs may be set based on the second pull-up code PC2, and the resistance values of the plurality of pull-down resistor legs may be set based on the second pull-down code NC2. The second memory data output circuit 725 may be coupled to the second data transmission line 742 through the second data pad 726. The second memory data output circuit 725 may include a plurality of pull-up resistor legs and a plurality of pull-down resistor legs. The resistance values of the plurality of pull-up resistor legs may be set based on the second pull-up code PC2, and the resistance values of the plurality of pull-down resistor legs may be set based on the second pull-down code NC2.

The second memory device 730 may include a second memory calibration circuit 731, a third memory data output circuit 733, and a fourth memory data output circuit 735. The second memory calibration circuit 731 may perform the calibration operation of the second memory device 730. The second memory calibration circuit 731 may generate a third pull-up code PC3 and a third pull-down code NC3 through the calibration operation. The third memory data output circuit 733 may be coupled to the first data transmission line 741 through the first data pad 734. The third memory data output circuit 733 may include a plurality of pull-up resistor legs and a plurality of pull-down resistor legs. The resistance values of the plurality of pull-up resistor legs may be set based on the third pull-up code PC3, and the resistance values of the plurality of pull-down resistor legs may be set based on the third pull-down code NC3. The fourth memory data output circuit 735 may be coupled to the second data transmission line 742 through the second data pad 736. The fourth memory data output circuit 735 may include a plurality of pull-up resistor legs and a plurality of pull-down resistor legs. The resistance values of the plurality of pull-up resistor legs may be set based on the third pull-up code PC3, and the resistance values of the plurality of pull-down resistor legs may be set based on the third pull-down code NC3.

The first memory device 720 may turn on at least one of the pluralities of resistor legs of the first memory data output circuit 723, based on a first chip calibration select signal CSCALSEL1. The first memory device 720 may turn on at least one of the pluralities of resistor legs of the second memory data output circuit 725, based on a second chip calibration select signal CSCALSEL2. The first and second chip calibration select signals CSCALSEL1 and CSCALSEL2 may be generated based on a chip select signal, which is used to select the first and second memory devices 720 and 730, and the calibration select signal CALSEL. The first memory device 720 may turn on at least one resistor leg of the first memory data output circuit 723, based on the first chip calibration select signal CSCALSEL1, and the turned-on resistor leg may be coupled to the first data transmission line 741. In the first memory device 720, the second chip calibration select signal CSCALSEL2 may be disabled, and all the resistor legs of the second memory data output circuit 725 may be turned off.

The second memory device 730 may turn on at least one of the pluralities of resistor legs of the third memory data output circuit 733, based on the first chip calibration select signal CSCALSEL1. The second memory device 730 may turn on at least one of the pluralities of resistor legs of the fourth memory data output circuit 735, based on the second chip calibration select signal CSCALSEL2. In the second memory device 730, the first chip calibration select signal CSCALSEL1 may be disabled, and all the resistor legs of the third memory data output circuit 733 may be turned off. The second memory device 730 may turn on at least one of the pluralities of resistor legs of the fourth memory data output circuit 735, based on the second chip calibration select signal CSCALSEL2. The turned-on resistor leg may be coupled to the second data transmission line 742.

The turned-on resistor leg in the first memory data output circuit 723 of the first memory device 720 may be coupled to the turned-on resistor leg in the first controller data output circuit 713, through the first data transmission line 741. The first memory calibration circuit 721 may perform the impedance calibration operation by comparing the resistance value of the turned-on resistor leg of the first controller data output circuit 713 and the resistance value of the turned-on resistor leg of the first memory data output circuit 723. The turned-on resistor leg in the fourth memory data output circuit 735 of the second memory device 730 may be coupled to the turned-on resistor leg in the second controller data output circuit 715, through the second data transmission line 742. The second memory calibration circuit 731 may perform the impedance calibration operation by comparing the resistance value of the turned-on resistor leg of the second controller data output circuit 715 with the resistance value of the turned-on resistor leg of the fourth memory data output circuit 735. Based on the first and second chip calibration select signals CSCALSEL1 and CSCALSEL2 generated based on the chip select signal and the calibration select signal CALSEL, the first memory device 720 and the second memory device 730 may be coupled to the first and second data transmission lines 741 and 742. The first memory device 720 may be coupled to the reference resistor provided from the controller 710 through the first data transmission line 741, and the second memory device 730 may be coupled to the reference resistor provided from the controller 710 through the second data transmission line 742. Accordingly, the calibration operations of the first and second memory devices 720 and 730 may be performed simultaneously. Various embodiments of the present disclosure may apply even when a semiconductor system includes three or more memory devices. For example, the respective memory devices may be coupled to different data transmission lines, and the calibration operations of a plurality of memory devices may be performed simultaneously.

Figure 8:
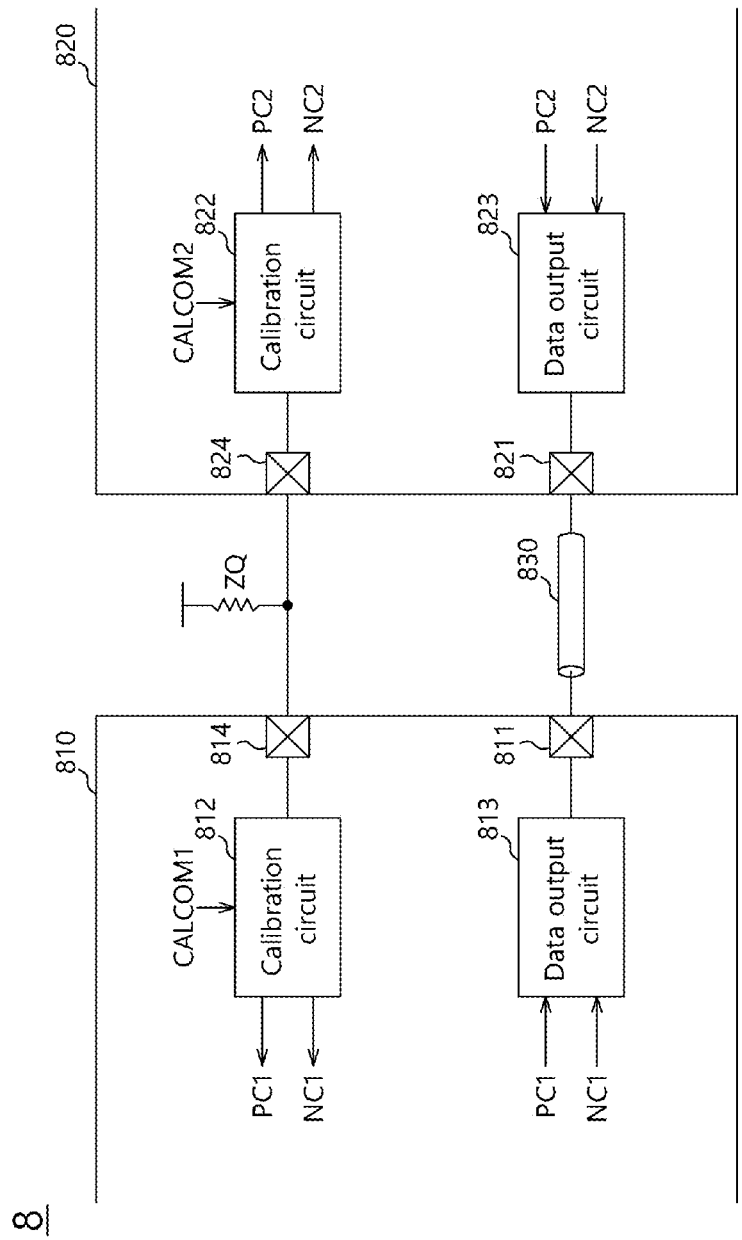
FIG. 8 is a diagram illustrating an example configuration of a semiconductor system in accordance with an embodiment.

FIG. 8 is a diagram illustrating an example configuration of a semiconductor system 8 in accordance with an embodiment. In FIG. 8, the semiconductor system 8 may include a controller 810 and a memory device 820. The controller 810 may include a controller calibration circuit 812 and a controller data output circuit 813. The controller calibration circuit 812 may be coupled to an external reference resistor ZQ through a resistor pad 814, and may perform the calibration operation of the controller 810. The controller calibration circuit 812 may be coupled to the external reference resistor ZQ based on a first calibration signal CALCOM1, and may generate a first pull-up code PC1 and a first pull-down code NC1 by using the external reference resistor ZQ. The controller data output circuit 813 may be coupled to a data transmission line 830 through a data pad 811. The controller data output circuit 813 may include a plurality of pull-up resistor legs and a plurality of pull-down resistor legs. The resistance values of the plurality of pull-up resistor legs may be set based on the first pull-up code PC1, and the resistance values of the plurality of pull-down resistor legs may be set based on the first pull-down code NC1.

The memory device 820 may include a memory calibration circuit 822 and a memory data output circuit 823. The memory calibration circuit 822 may be coupled to the external reference resistor ZQ through a resistor pad 824, and may perform the calibration operation of the memory device 820. The memory calibration circuit 822 may be coupled to the external reference resistor ZQ based on a second calibration signal CALCOM2, and may generate a second pull-up code PC2 and a second pull-down code NC2 by using the external reference resistor ZQ. The memory data output circuit 823 may be coupled to the data transmission line 830 through a data pad 821. The memory data output circuit 823 may include a plurality of pull-up resistor legs and a plurality of pull-down resistor legs. The resistance values of the plurality of pull-up resistor legs may be set based on the second pull-up code PC2, and the resistance values of the plurality of pull-down resistor legs may be set based on the second pull-down code NC2.

The controller 810 may generate the first and second calibration signals CALCOM1 and CALCOM2 for the calibration operations of the controller 810 and the memory device 820. The enable periods of the first and second calibration signals CALCOM1 and CALCOM2 may not overlap each other. If the first calibration signal CALCOM1 is enabled, the controller calibration circuit 812 may be coupled to the external reference resistor ZQ and perform the calibration operation of the controller 810. The controller calibration circuit 812 may generate the first pull-up code PC1 and the first pull-down code NC1 through the calibration operation. The controller data output circuit 813 may set its resistance values based on the first pull-up code PC1 and the first pull-down code NC1. Thereafter, if the second calibration signal CALCOM2 is enabled, the memory calibration circuit 822 may be coupled to the external reference resistor ZQ and perform the calibration operation of the memory device 820. The memory calibration circuit 822 may generate the second pull-up code PC2 and the second pull-down code NC2 through the calibration operation. The memory data output circuit 823 may set its resistance values based on the second pull-up code PC2 and the second pull-down code NC2. By controlling the first and second calibration signals CALCOM1 and CALCOM2, the controller 810 and the memory device 820 may share the external reference resistor ZQ. Therefore, the semiconductor system 8 does not need to have external reference resistors separately for both the controller 810 and the memory device 820. Various embodiments of the present disclosure may be applied in a similar manner even in the case where a semiconductor system includes a plurality of memory devices. In the case where a semiconductor system includes two or more memory devices, the two or more memory devices may be coupled sequentially to an external reference resistor and perform calibration operations.

While various embodiments have been described above, it will be understood to those skilled in the art that the embodiments described are examples only. Accordingly, the semiconductor device and system performing a calibration operation described herein should not be limited based on the described embodiments.

What is claimed is:

1. A method of operating a semiconductor system including a controller and a memory device coupled to each other through a signal transmission line, the method comprising:
    performing a calibration operation of the controller by being coupled to an external reference resistor;
    setting a resistance value of a controller output circuit coupled to the signal transmission line, based on a result of the calibration operation of the controller;
    performing a calibration operation of the memory device by being coupled to the controller output circuit through the signal transmission line and by being coupled to a reference resistor provided from the controller output circuit; and
    setting a resistance value of a memory output circuit coupled to the signal transmission line, based on a result of the calibration operation of the memory device.

2. The method according to claim 1, wherein the controller output circuit includes a plurality of pull-up resistor legs and a plurality of pull-down resistor legs, and wherein the method further comprises, before performing the calibration operation of the memory device, coupling at least one of the plurality of pull-up resistor legs and the plurality of pull-down resistor legs of the controller output circuit, to the signal transmission line.

3. The method according to claim 2, wherein the memory circuit includes a plurality of pull-up resistor legs and a plurality of pull-down resistor legs, and wherein the method further comprises, before performing the calibration operation of the memory device, coupling at least one of the plurality of pull-up resistor legs and the plurality of pull-down resistor legs of the memory output circuit, to the signal transmission line.

4. A semiconductor system comprising:
    a controller coupled to first and second signal transmission lines;
    a first memory device coupled to the first and second signal transmission lines, and including a first memory calibration circuit; and
    a second memory device coupled to the first and second signal transmission lines, and including a second memory calibration circuit,
    wherein the first memory calibration circuit performs a calibration operation by being coupled to the first signal transmission line based on a first chip calibration select signal, and the second memory calibration circuit performs a calibration operation by being coupled to the second signal transmission line based on a second chip calibration select signal.

5. The semiconductor system according to claim 4, wherein the first memory calibration circuit and the second memory calibration circuit perform the impedance calibration operations simultaneously.

6. The semiconductor system according to claim 4, wherein the controller comprises:
    a controller calibration circuit configured to perform a calibration operation by being coupled to an external reference resistor;
    a first controller output circuit coupled to the first signal transmission line, a resistance value of the first controller output circuit being set by the controller calibration circuit; and
    a second controller output circuit coupled to the second signal transmission line, a resistance value of the second controller output circuit being set by the controller calibration circuit.

7. The semiconductor system according to claim 6, wherein the first memory device further includes:
    a first memory output circuit coupled to the first signal transmission line, a resistance value of the first memory output circuit being set by the first memory calibration circuit; and
    a second memory output circuit coupled to the second signal transmission line, a resistance value of the second memory output circuit being set by the first memory calibration circuit.

8. The semiconductor system according to claim 7, wherein the first memory output circuit includes a plurality of pull-up resistor legs and a plurality of pull-down resistor legs both coupled to the first signal transmission line, and the second memory output circuit includes a plurality of pull-up resistor legs and a plurality of pull-down resistor legs both coupled to the second signal transmission line, and wherein at least one of the pluralities of resistor legs of the first memory output circuit is turned on based on the first chip calibration select signal, and all of the pluralities of resistor legs of the second memory output circuit are turned off based on the second chip calibration select signal.

9. The semiconductor system according to claim 6, wherein the second memory device further includes:
    a third memory output circuit coupled to the first signal transmission line, a resistance value of the third memory output circuit being set by the second memory calibration circuit; and
    a fourth memory output circuit coupled to the second signal transmission line, a resistance value of the fourth memory output circuit being set by the second memory calibration circuit.

10. The semiconductor system according to claim 9, wherein the third memory output circuit includes a plurality of pull-up resistor legs and a plurality of pull-down resistor legs both coupled to the first signal transmission line, and the fourth memory output circuit includes a plurality of pull-up resistor legs and a plurality of pull-down resistor legs both coupled to the second signal transmission line, and wherein all of the pluralities of resistor legs of the third memory output circuit are turned off based on the first chip calibration select signal, and at least one of the pluralities of resistor legs of the fourth memory output circuit is turned on based on the second chip calibration select signal.

* * * * *